United States Patent [19]
Soares et al.

[11] Patent Number: 5,162,754
[45] Date of Patent: Nov. 10, 1992

[54] ULTRA-WIDEBAND DC-MICROWAVE AMPLIFIER DEVICE NOTABLY IN INTEGRATED CIRCUIT FORM

[75] Inventors: Robert Soares, Perros-Guirrec; Serge Mottet, Trebeurden; Georges Follot, Pluznet; Andre Perennec, Brest, all of France

[73] Assignee: France Telecom (CNET), France

[21] Appl. No.: 693,857

[22] Filed: Apr. 29, 1991

[30] Foreign Application Priority Data

May 3, 1990 [FR] France ............................ 90 05855

[51] Int. Cl.⁵ .................................................. H03F 3/16
[52] U.S. Cl. ................................... 330/277; 330/308; 250/214 A
[58] Field of Search ................... 330/277, 59, 308; 250/214 A

[56] References Cited

U.S. PATENT DOCUMENTS

| | | | |
|---|---|---|---|
| 4,011,518 | 3/1977 | Irvine et al. | 330/277 X |
| 4,612,514 | 9/1986 | Shigaki et al. | 330/277 |
| 4,841,253 | 6/1989 | Crabill | 330/277 |

OTHER PUBLICATIONS

Y. Miyagawa et al., *Electronics Letters*, "7GHz Bandwidth Optical Front-End Circuit using GaAs FET Monolithic IC Technology", Sep. 14, 1989, vol. 25, pp. 1305–1307.

*Primary Examiner*—James B. Mullins
*Attorney, Agent, or Firm*—Kinney & Lange

[57] ABSTRACT

An amplification device relating to the field of the amplification of ultra-wideband electrical signals from the dc to the microwave range, and more precisely from dc to microwaves of over 6 GHz, notably for the amplification of signals transmitted at very high bit rates on optic fibers, of the type including at least one ampification stage, the active amplification element of which is a field-effect transistor mounted as a common source, each of the amplification stages including means for the simultaneous maintaining of a positive dc voltage bias on the drain of the amplification transistor and a negative or zero dc bias on the gate of the transistor. This device may advantageously be made in monolithic integrated circuit form.

28 Claims, 3 Drawing Sheets

ULTRA-WIDEBAND DC-MICROWAVE AMPLIFIER DEVICE NOTABLY IN INTEGRATED CIRCUIT FORM

BACKGROUND OF THE INVENTION

1. Field of the Invention

The field of the invention is that of the amplification of ultra-wideband electrical signals from the dc to the microwave range, and notably from the dc range up to microwave frequencies of over 6 GHz.

A preferred application of the invention is in the amplification of signals transmitted by transmission systems at very high bit rates, notably in monomode optic fibers.

The rapid increase in traffic in transmission systems in recent years has fostered the development of optic systems of monomode transmission at very high bit rates. The optic repeaters made for such systems require the installation of fast electronic circuits for modulation at transmission and demodulation at reception. In these repeaters, or optic heads, ultra-wideband amplifiers are needed for the modulation of the transmission laser diode and for the demodulation of the reception photodiode.

The invention can also be used in instrumentation, for example for the making of amplifiers for fast pulses or steps with short rise times, as well as for military applications, notably in the field of video amplifiers, medical applications and, more generally, in all fields where it is necessary to amplify over a very wide band of frequencies.

2. Description of the Prior Art

It is known that the active elements used in the building of dual-access amplifiers (transistors) have the particular characteristic of needing different dc biases at each access.

It therefore becomes necessary, in an amplifier with several stages, to use either high value capacitors, to let through the low frequencies, or dc amplifier topologies to enable the independent biasing of each amplifier stage.

For example, there are known intra-stage capacitor amplifiers such as the amplifiers SHF 74 and SHF 74P, marketed by the firm SHF-DESIGN BERLIN (Trade Name). In such amplifiers, the capacitors used have a value of 10 nF. They can therefore be made only by means of hybrid technology.

The ultra-wide frequency band is obtained by using a feedback loop at each stage, with a 50 pF capacitor in the loop, so that different dc biases can be maintained at each transistor access. Such amplifiers have a flat gain of about 2 dB in a 500 KHz–8 GHz band.

Apart from the problems of their implementation, requiring the use of hybrid circuits, amplifiers with capacitors have to cope with the fact that it is impossible, owing to the very principle of the capacitor, to amplify the low frequencies (between 0 and 500 KHz in this example).

The use of the capacitors may be avoided in dc amplifiers made by monolithic microwave integrated circuit (MMIC) technology, such as those described by Colleran W. T. and A. A. Abidi in "A 3.2 GHz, 26 dB Wideband Monolithic Matched GaAs MESFET Feedback Amplifier Using Cascodes" (IEEE Trans. Microwave Theory Tech., Vol. MTT-36 pp. 1377–1385, October, 1988).

These amplifiers have a series of amplification stages based on gallium arsenide MES field-effect transistors (GaAs MESFETs). The independence of bias between the drain of the active transistor of a stage and the gate of the active transistor of the next stage is achieved by two transistors and a diode bridge. Amplifiers of this type, made by MMIC technology based on GaAs MESFETs with a gate length of 1 $\mu$m are limited, in high frequency, to less than 3.5 GHz. The use of a technology based on transistors with a gate length of 0.5 $\mu$m extends this upper limit to 5 GHz.

Certain improvements in this technique, enabling substantial increases in efficiency, are known. Thus, for example, it is possible to place a capacitor in parallel on the diode bridge, as is described in the article by Miyagawa et al., "7 GHz Bandwidth Optical Front-End Circuit Using GaAs FET Monolithic IC Technology" (Electronics Letters, Vol. 25, No. 19, Sep. 14, 1989, pp. 1305–1306).

The frequency band of an amplifier such as this can also be increased by about 25%, by using cascode-mounted transistors.

The use of transistors to separate the amplification stages has proved to be very effective with respect to the dc insulation between the stages. By contrast, these transistors go off very swiftly at high frequencies. Furthermore, problems of resonance soon come up. Such amplifiers are therefore limited in the microwave range, owing to their basic principle.

Another way of making an ultra-wideband amplifier is proposed by Kahlert J, Piscalar W. and Mulombe N. in "DC-12.3 GHz Broadband Amplifier" (El. Lett. Vol. 25, No. 21, pp. 1453–1465, Oct. 12, 1989). This is an amplifier with spectral duplexing, in which the lower and upper frequencies are separated by a network made up of capacitors and resistors. That part of the signal that is formed by high frequencies is amplified normally, and the low-frequency component is amplified by a series of operational amplifiers before being reinjected into the gate of the amplification transistor. The network of operational amplifiers is also used to bias this transistor. A two-stage amplifier thus made in hybrid circuit form can be used to obtain a gain of 10 dB±from dc to 12.3 GHz.

The amplifiers with spectral duplexing can be made only by means of hybrid technology. Besides, their design is relatively complex, and they include a relatively large number of basic components.

The invention is designed to overcome these different drawbacks of the prior art.

SUMMARY OF THE INVENTION

More precisely, an essential aim of the invention is to provide an ultra-wideband amplification device, for amplification from dc to frequencies of over 6 GHz, that is notably applicable to transmission by monomode optic fiber. It is thus notably an aim of the invention to provide a device of this type that is not restricted in its microwave performance characteristics by the components and architecture used.

Another aim of the invention is to provide an amplification device such as this that can be easily used in integrated circuit form, and notably in monolithic microwave integrated circuits (MMIC).

A particular aim of the invention is to provide a dc-microwave amplifier device that does not require the use of high value capacitors, or of any other component that would dictate its fabrication in hybrid circuit form.

Another aim of the invention is to provide an amplification device such as this that does not use transistors to provide for the voltage offset between two consecutive amplification stages, said transistors limiting the performance characteristics of amplifiers in the high frequency ranges.

Another aim of the invention is to provide an amplification device such as this with a low cost price, namely with a reduced number of components and, notably, a reduced number of active components.

Another important aim of the invention is to limit the different phenomena of microwave disturbances that may appear in such amplification devices. Notably, the invention seeks to avoid the use of transistors to ensure insulation between two amplification stages.

The invention is also aimed at providing an amplification device with high amplification gain.

These aims, as well as others that shall appear here below, are achieved by means of an ultra-wideband dc-microwave amplification device, notably for the amplification of signals transmitted at very high bit rates on optic fibers, of the type including at least one amplification stage, the active amplification element of which is a field-effect transistor mounted as a common source, each of said amplification stages including means for the simultaneous maintaining of a positive dc voltage bias on the drain of said amplification transistor and a negative or zero dc bias on the gate of said transistor.

Advantageously, said means for maintaining a positive dc voltage bias on the drain of said amplification transistor are constituted by a field-effect transistor working as a saturable load, the gate being connected to the source, and the drain being supplied from a positive voltage source.

In a preferred embodiment of the invention, said means for maintaining a negative or zero dc voltage bias on the gate of said amplification transistor include a resistor, connecting said gate to the ground.

The bias voltage is then zero. A negative bias voltage enabling the sensitivity of the amplifier to be increased may be obtained, for example, by the addition of a second resistor connecting said gate of said amplification transistor to a negative voltage source.

In another advantageous embodiment of the invention, said means for maintaining a negative or zero dc voltage bias at the gate of said amplification transistor include a first resistor connecting said gate to a positive voltage source and a second resistor connecting said gate to a negative voltage source.

Advantageously, the amplification device also has means to maintain a zero dc voltage at output of said amplification stage.

These means for maintaining a zero dc voltage at output of said amplification stage may notably include a bridge of diodes, providing for a voltage drop between the drain of said amplification transistor and said output of the amplification stage substantially equal to the voltage between the drain and the source of said transistor.

Advantageously, said transistor working as a saturable load has a gate spread sufficient to enable the simultaneous dc supply of said amplification transistor and of said diode bridge above the threshold current.

It must be noted that this transistor is used only for the current supply of the amplification transistor and of the diode bridge, and that is does not come into play in the function of voltage offset between two amplification stages. This role is played by the diode bridge alone.

Thus, there is no intrinsic limit (due to the transistor) on the performance characteristics, in the microwave range, of the amplifier.

Preferably, the amplification device includes means for maintaining a constant current greater than the threshold current in said diode bridge.

In a particular embodiment of the invention, said means for maintaining a constant current are constituted by a field-effect transistor working as a saturable load, the gate being connected to the source, and being supplied from a negative voltage source.

Advantageously, a capacitor is placed in parallel with said diode bridge, so as to compensate for the losses at high frequencies.

Preferably, the amplification device includes a feedback resistor, placed between the gate of said amplification transistor and the output of said amplification stage.

The device of the invention may also include at least one no-loss matching network, placed at input of said amplification stage and/or at output of said amplification transistor.

Advantageously, said matching networks are localized elements and/or microstrip distributed elements.

In a particular embodiment of the invention, said field-effect transistors are gallium arsenide transistors. They may also advantageously be heterojunction transistors with high electron mobility.

The amplification device of the invention may be advantageously fitted into a monolithic microwave integrated circuit.

BRIEF DESCRIPTION OF THE DRAWINGS

Other features and advantages of the invention shall appear from the following description of a preferred embodiment of the device of the invention, given as a non-restrictive example, and from the appended drawings, of which.

DETAILED DESCRIPTION OF THE INVENTION

The particular embodiment described here below can be applied notably to the reception of signals transmitted at very high bit rate in monomode optic fibers. It is clear, however, that the device of the invention can find numerous applications in other fields, notably whenever amplification has to be done over a very wide range of frequencies, possibley from the dc to the microwave range.

Figure 1:
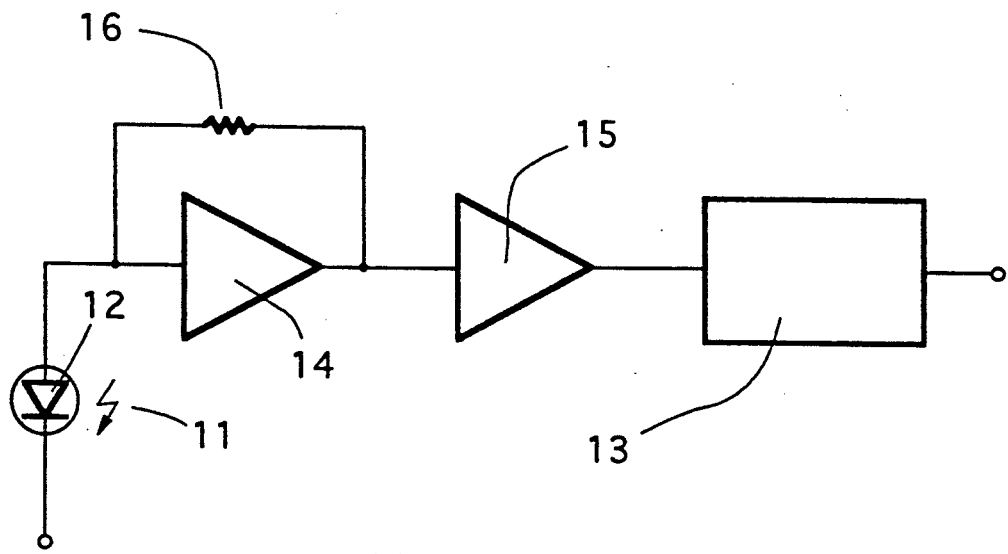
FIG. 1 shows a block diagram of an optic reception head having two amplifiers.

FIG. 1 shows a block diagram of an optic reception head. In a standard way, the transmitted signals 11 are received by a photodiode 12.

These signals are transmitted to the demodulation module 13 by means of two amplifiers 14 and 15.

The first amplifier 14 is a transimpedance amplifier comprising a resistor 16 in parallel. Its main purpose is to achieve an impedance matching between the photodiode 12 and the following circuits 15, 13. Indeed, a photodiode has an impedance, the resistive part of which is quasi-infinite, while the amplification circuit 15 and demodulation circuit 13 work in a standard way with an input resistance of the order of 50 Ω.

In the optic field, the dual goal sought is that of obtaining a widest possible frequency band, with the lowest possible noise. The transimpedance amplifier 14 or preamplifier should therefore achieve the best possible compromise between the (minimal) damping and the (maximal) bandwidth. Advantageously, it can also be used to obtain a small gain amplification.

The second amplifier 15, or post-amplifier, is aimed at amplifying the signal before the demodulation 13. It has, for example, an input and output impedance of about 50 Ω.

The two amplifiers 14 and 15 may advantageously be made according to the topology of the invention. This makes it possible, in effect, to avert problems of limits in the microwave range. The exemplary embodiment shown in FIG. 3 corresponds more precisely to the post-amplifier 15.

Figure 2:
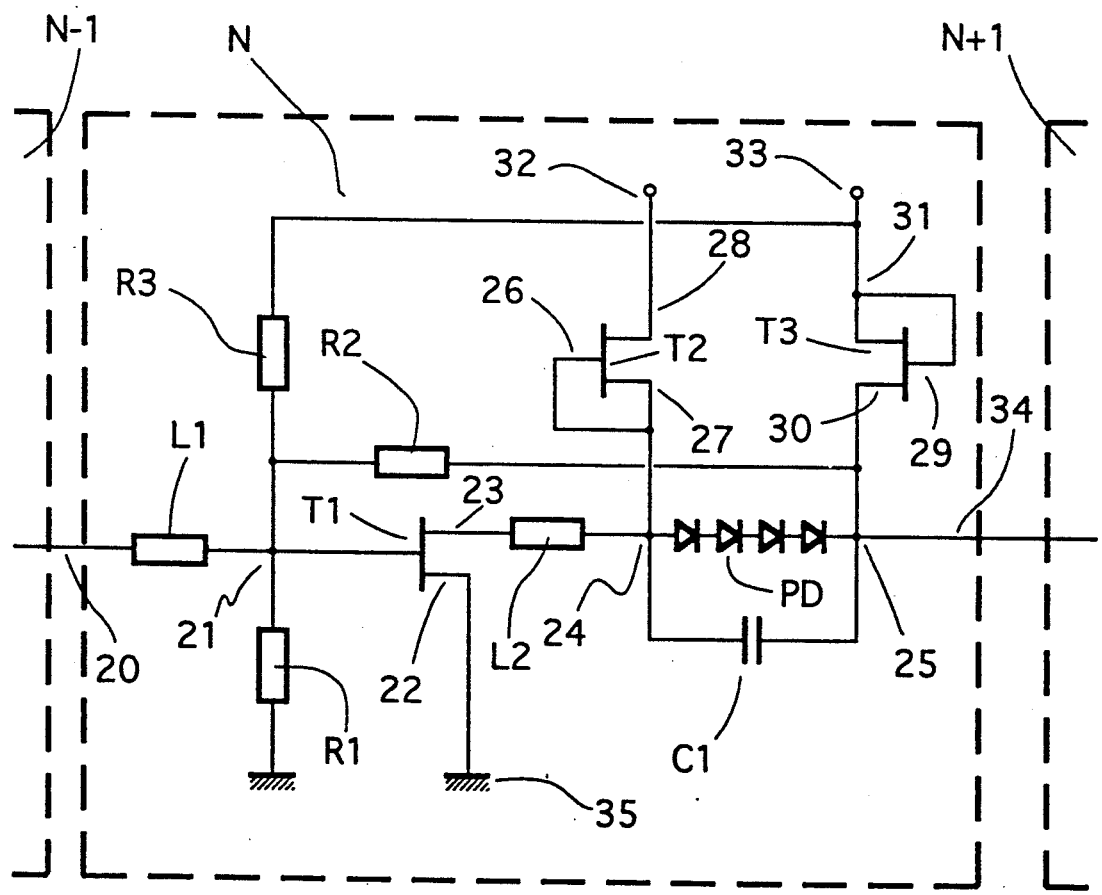
FIG. 2 shows an electrical diagram of a stage of an amplification device according to the invention, as used in the optic reception head of FIG. 1.

FIG. 2 shows the electrical diagram of a particular embodiment of an amplification stage N according to the invention.

The active amplification element of this stage is a field-effect transistor (FET) T1 mounted as a common source. The source 22 of this transistor T1 is connected to the ground 35 of the circuit. The signal 20 to be amplified is injected into the gate 21 of T1 and the amplified signal is obtained at the drain 23 of this transistor T1.

The device includes means for simultaneously maintaining the biases of positive voltage at the drain 23 and of zero voltage at the gate 21 of the transistor working as a common source T1.

A zero gate voltage may be provided at each stage by a single resistor R1 that connects the gate 21 of this stage to the ground 35.

In another embodiment, the gate voltage may be kept negative. Indeed, a negative gate-source voltage enables an increase in the sensitivity of the amplifier. For this purpose, a bridge of resistors R1, R3 is used, R1 being connected to the ground and R3 to a negative voltage $V_{SS}$ source 33. The ratio of the values of the resistors R1 and R3 can be used to obtain, as a function of the voltage $V_{SS}$ source 33, the negative voltage desired at the gate 21 of the transistor T1.

Figure 4:
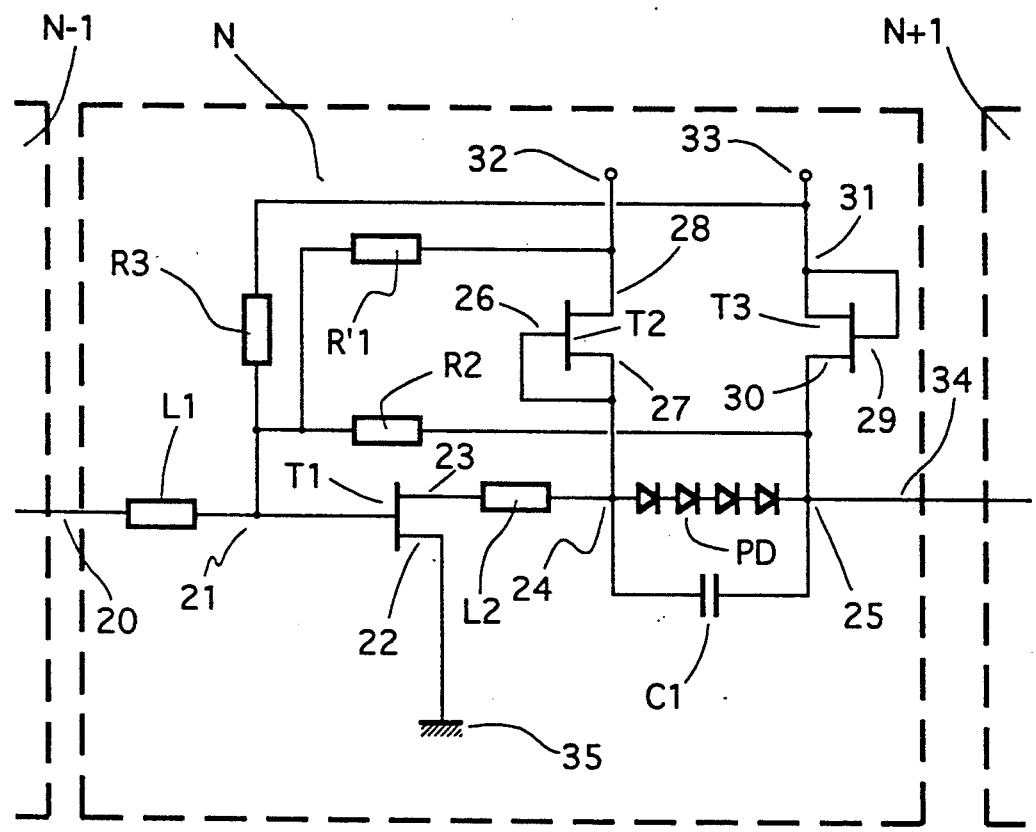
FIG. 4 shows an electrical diagram of a stage of an amplification device according to a modification of the present invention.

According to another embodiment shown in FIG. 4, this negative voltage can also be obtained by means of a bridge of resistors in which the first resistor $R_1$ is connected to the positive voltage $V_{DS}$ source 32 and the second resistor $R_3$ is connected to the negative voltage $V_{SS}$ source 33.

The drain of the transistor T1 is supplied with voltage $V_{DS}$ by means of a field-effect transistor T2 working as a saturable load. The gate 26 of this transistor T2 is connected to the source 27 which is itself connected at the corresponding node 24, with respect to the dc operation, to the drain 23 of the transistor T1. The drain 28 of the transistor T2 is connected to a positive dc voltage $V_{DS}$ source 32.

In a device such as this, with several amplification stages N−1, N, N+1, the dc voltage at output of each stage N must be lowered so as to have a negative or zero dc voltage at input of the stage N+1.

According to the prior art, this offset voltage function is fulfilled, for example, by one or more transistors and a diode bridge. This approach has the advantage of being easy to implement and of giving good dc insulation between the stages. However, it entails limits on the performance characteristics of the amplifier, in the high frequency range. For, the transistors get cut off very soon at the high frequencies, and problems of resonance arise. Thus, this type of assembly is limited to 3 or 4 GHz, depending on its complexity and on the performance characteristics, in the microwave range, of the transistors used.

In the device of the invention, the offset function is fulfilled by a single bridge of diodes PD connecting the output 24 of the amplification element T1 to the output 25 of the amplification stage N. In this case, there is no intrinsic limit on the performance of the amplifier in the microwave range, since no transistor is used to separate the amplification stages.

The number and size of the diodes of the diode bridge PD are chosen as a function of the dc supply (drain voltage and current) requirements of the transistor T1 as a common source. The voltage drop through the diode bridge PD is equal to the voltage between drain 23 and $V_{DS}$ source 22 of the transistor T1. In the embodiment shown, since the source 22 is connected to the ground 35, this drop in voltage is equal to the voltage between the drain 23 and the ground. Thus, the voltage is brought to a zero voltage between the output 25 of the amplification stage N and the ground 35.

The threshold current flowing in this diode bridge PD is kept constant by a transistor T3, the gate 29 of which is attached to the source 31 in order to create a saturable load. This transistor T3 is supplied at its source 31 from a negative voltage $V_{SS}$ source 33 in order to provide sufficient current in the diode bridge PD to maintain the zero dc voltage at the output 25 of the stage N to which the drain 30 is connected.

A capacitor CI is placed in parallel with the diode bridge PD, between the output 24 of the amplification element T1 and the output 25 of the amplification stage N. This makes it possible to compensate for the high frequency losses due to the diode bridge PD.

A feedback resistor R2 placed between the input 21 and the output 25 of the amplification stage makes it possible to achieve the dynamic performance of the device without detriment to the conditions of static polarization. This resistor R2 is notably aimed at facilitating the matching of the transistor T1 and at thus obtaining the widest possible frequency band. Besides, it also makes it possible to provide for the stability of the device and a flat amplification gain.

Matching networks with no-loss elements L1, L2 at each stage make it possible, with the resistors R1 and R2, to achieve the ultra-wideband matching of the transistors. These networks may be made either with localized elements or with microstrip distributed elements or again with a mixture of these two types of elements.

The first matching network L1 is placed between the input 20 of each amplification stage and the gate 21 of the transistor T1. The second network L2 is connected, firstly, to the drain 23 of the transistor T1 and, secondly, to the node 24 corresponding to the input of the diode bridge PD and to the source 27 of the transistor T2.

A device such as this may advantageously include several amplification stages N−1, N, N+1 that are similar to the one described.

A method of determining the size of the different transistors T1, T2 and T3 and of the diodes of the diode bridge PD is specified here below.

The first step is the choice of the gate spread of the transistor T1, as a function of microwave considerations (gain, noise, matching). Thus, the drain-source current $I_{DS}$ of the transistor T1 is established.

The size, namely the spread of the anode, of the diodes in the diode bridge PD Is then chosen as a function of a compromise between the alternating current losses and the direct current $I_{PD}$ consumption in the diode bridge PD. The size of the diodes may be chosen, for example, so that the current $I_{PD}$ is lower than or equal to $I_{DS}/6$. It is clear, moreover, that $I_{PD}$ should be greater than or equal to the threshold current of the diodes.

The size of the gate of the transistor T3, which works like a saturable load, is then chosen in order to maintain the current $I_{PD}$ in the diode bridge.

Finally, the size of the transistor gate T2 is chosen so that the current $I_{DD}$ is equal to $I_{DS}+I_{PD}$.

The drain of the saturable load T2 is supplied from a positive voltage source $V_{DD}$ chosen so as to maintain the drain-source voltage $V_{DS}$ at the terminals of the transistor T1 at the level needed to provide for its optimum functioning in amplification.

In the same way, the source of the saturable load T3 is supplied from a negative voltage source $V_{SS}$, chosen so as to maintain a zero voltage between the node 25 and the ground 35.

Figure 3:
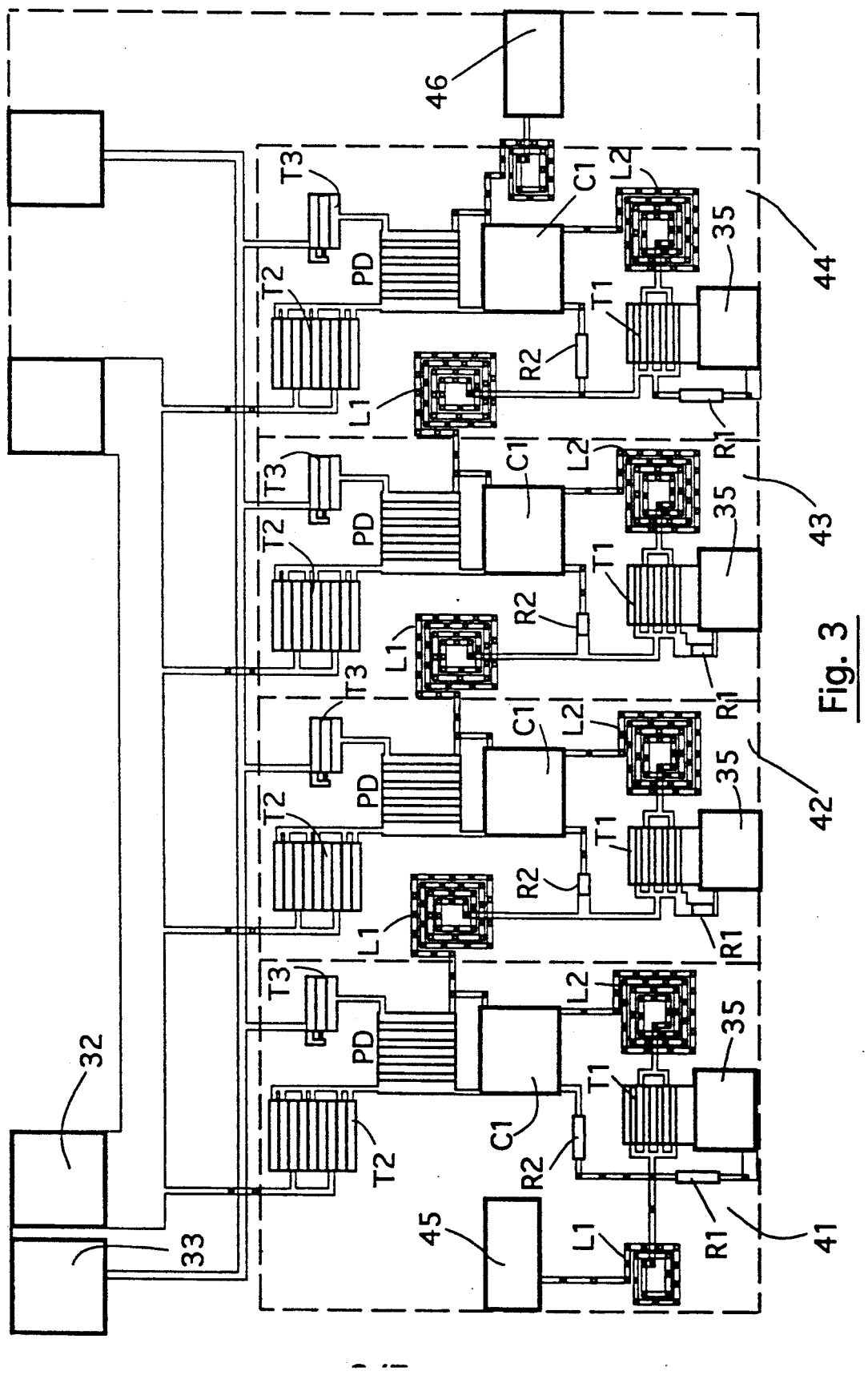
FIG. 3 exemplifies a topography, on an integrated circuit, of a four-stage amplification device as shown in FIG. 2.

FIG. 3 shows an example of a topography on an integrated circuit of an amplification device such as this with four stages 41, 42, 43 and 44 made by means of monolithic microwave integrated circuit (MMIC) technology based on gallium arsenide MES field-effect transistors (GaAs MESFETs). This circuit follows the rules of the foundry GaAs MESFET MMIC ANADIGICS (Trade Mark).

The signal to be amplified is introduced to the input contact 45 and successively amplified by the four amplification stages 41, 42, 43 and 44. The amplified signal is recovered at the output contact 46. Each amplification stage is, in principle, identical to that of the electrical diagram of FIG. 2. It will be noted, however, that the gate dc voltage of the transistor T1 is kept at zero, since there is no bridge of resistors R1, R3 but only one resistor R1 connected to the ground 35.

This four-stage amplification device can be used to obtain a dc gain at 10 GHz of 22 dB±1.5 dB.

It is naturally possible make the device of the invention according to other technologies and, for example, by means of transistors with high electron mobility.

What is claimed is:

1. An ultra-wideband dc-microwave amplifier, notably for the amplification of signals transmitted at very high bit rates on optic fibers, having a signal input where a signal to be amplified is susceptible to be supplied and a signal output providing for a corresponding amplified signal, the amplifier comprising:

an amplification field-effect transistor operating in a common source mode and having a gate, a source and a drain, the gate of the amplification field-effect transistor being operatively connected to said signal input, offset means having an input terminal and an output terminal and comprising a diode bridge having at least one diode, said input terminal being operatively connected to the drain of said amplification field-effect transistor and said output terminal being operatively connected to said signal output, said offset means providing for a voltage drop substantially equal to the dc voltage between the drain and the source of said amplification field-effect transistor, load element means comprising a first field-effect transistor operating as a saturable load and having a gate, a source and a drain, the gate of the first field-effect transistor, being connected to the source of the first field-effect transistor and the drain of the first field-effect transistor being operatively connected to a positive direct current source, said load element means simultaneously maintaining a positive dc voltage bias on the drain of said amplification field-effect transistor and on the input terminal of said offset means; and means for maintaining a dc bias on the gate of said amplification field-effect transistor, comprising a resistor connected betweeen the gate of the amplification field-effect transistor and a source of negative or zero dc bias.

2. An amplifier according to claim 1, wherein a threshold current flows in said diode bridge, said amplifier further comprising means for maintaining a constant current greater than the threshold current in said diode bridge comprising a second field-effect transistor operating as a saturable load having a gate and a source, the gate of the second field-effect transistor being connected to the source of the second field-effect transistor, and being supplied from a negative voltage source.

3. An amplifier according to claim 1, further including a capacitor in parallel with said diode bridge to compensate for losses at high frequencies.

4. An amplifier according to claim 1, further including a feedback resistor, connected between the gate of said amplification field-effect transistor and said signal output.

5. An amplifier according to claim 1, further including no loss matching network means, operatively connected between said signal input and the gate of said amplification field-effect transistor.

6. An amplifier according to claim 5, wherein said matching network means comprise localized elements.

7. An amplifier according to claim 5, wherein said matching network means comprise microstrip distributed elements.

8. An amplifier according to claim 1, wherein said amplification field-effect transistor and said first field-effect transistor are gallium arsenide transistors.

9. An amplifier according to claim 1, fitted into a monolithic microwave integrated circuit.

10. An amplifier according to claim 1, further including no-loss matching network means, operatively connected between said the drain of said amplification field-effect transistor and the input terminal of said offset means.

11. An amplifier according to claim 1, wherein said amplification field-effect transistor and said first field-effect transistor are heterojunction transistors with high electron mobility.

12. An amplifier according to claim 1, wherein the offset means consists of a bridge of diodes.

13. An ultra-wideband dc-microwave amplification device comprising at least two amplification stages, each of said amplification stages comprising amplifiers according to claim 1 and the signal output of a first of said amplifiers being operatively connected to the signal input of a second of said amplifiers.

14. An ultra-wideband dc-microwave amplifier, notably for the amplification of signals transmitted at very high bit rates on optic fibers, having a signal input where a signal to be amplified is susceptible to be supplied and a signal output providing for a corresponding amplified signal, the amplifier comprising:

an amplification field-effect transistor operating in a common source mode and having a gate, a source and a drain, the gate being operatively connected to said signal input, offset means having an input terminal and an output terminal and comprising a diode bridge comprising at least one diode, said input terminal being operatively connected to the drain of said amplification field-effect transistor and said output terminal being operatively connected to said signal output, said offset means providing for a voltage drop substantially equal to the dc voltage between the drain and the source of said amplification field-effect transistor, load element means operatively connected to a positive direct current source and simultaneously maintaining a positive dc voltage bias on the drain of said amplification field-effect transistor and on the input terminal of said offset means; and means for maintaining a dc bias on the gate of said amplification field-effect transistor so that the dc bias is negative or zero.

15. An amplifier according to claim 14, further including no-loss matching network means, operatively connected between said the drain of said amplification field-effect transistor and the input terminal of said offset means.

16. An amplifier according to claim 15, wherein said matching network means comprise microstrip distributed elements.

17. An amplifier according to claim 15, wherein said matching network are means comprise localized elements.

18. An amplifier according to claim 14, wherein said field-effect transistor is a heterojunction transistor with high electron mobility.

19. An ultra-wideband dc-microwave amplification device comprising at least two amplification stages, each of said amplification stages comprising amplifiers according to claim 14 and the signal output of a first of said amplifiers being operatively connected to the signal input of a second of said amplifiers.

20. An amplifier according to claim 14, wherein a threshold current flows in said diode bridge, said amplifier further comprising means for maintaining a constant current greater than the threshold current in said diode bridge including a second field-effect transistor operating as a saturable load having a gate and a source, the gate of the second field-effect transistor being connected to the source of the second field-effect transistor, and being supplied from a negative voltage source.

21. An amplifier according to claim 14, further including a capacitor in parallel with said diode bridge to compensate for losses at high frequencies.

22. An amplifier according to claim 14, further including a feedback resistor, connected between the gate of said amplification field-effect transistor and said signal output.

23. An amplifier according to claim 14, further including no loss matching network means, operatively connected between said signal input and the gate of said amplification field-effect transistor.

24. An amplifier according to claim 14, wherein said field-effect transistor is a gallium arsenide transistor.

25. An amplifier according to claim 14, fitted into a monolithic microwave integrated circuit.

26. An amplifier according to claim 14, wherein the offset means consists of a bridge of diodes.

27. An amplifier according to claim 14, wherein said means for maintaining a dc voltage bias on the gate of said amplification field-effect transistor include a first resistor connecting said gate to ground and a second resistor connecting said gate to a negative voltage source.

28. An amplifier according to claim 14, wherein said means for maintaining a dc voltage bias on the gate of said amplification field-effect transistor include a first resistor connecting said gate to a positive voltage source and a second resistor connecting said gate to a negative voltage source.

* * * * *